(12) United States Patent
Hush

(10) Patent No.: US 11,508,431 B2
(45) Date of Patent: Nov. 22, 2022

(54) LOGICAL OPERATIONS USING A LOGICAL OPERATION COMPONENT

(71) Applicant: Micron Technology, Inc., Boise, ID (US)

(72) Inventor: Glen E. Hush, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/001,534

(22) Filed: Aug. 24, 2020

(65) Prior Publication Data

US 2020/0388321 A1    Dec. 10, 2020

Related U.S. Application Data

(62) Division of application No. 16/120,739, filed on Sep. 4, 2018, now Pat. No. 10,755,766.

(51) Int. Cl.
| | |
|---|---|
| G11C 11/04 | (2006.01) |
| G11C 11/4091 | (2006.01) |
| H03K 19/21 | (2006.01) |
| G11C 11/404 | (2006.01) |
| G11C 7/08 | (2006.01) |
| G11C 11/405 | (2006.01) |
| H03K 19/20 | (2006.01) |

(52) U.S. Cl.
CPC .......... *G11C 11/4091* (2013.01); *G11C 7/08* (2013.01); *G11C 11/404* (2013.01); *G11C 11/405* (2013.01); *H03K 19/20* (2013.01); *H03K 19/215* (2013.01)

(58) Field of Classification Search
CPC .................................................. G11C 11/405
USPC ........................................................ 365/149
See application file for complete search history.

(56) References Cited

U.S. PATENT DOCUMENTS

| | | | |
|---|---|---|---|
| 5,496,756 | A | 3/1996 | Sharma et al. |
| 5,909,400 | A | 6/1999 | Bertin et al. |
| 6,661,701 | B2 | 12/2003 | Dahl et al. |
| 6,809,979 | B1 | 10/2004 | Tang |

(Continued)

FOREIGN PATENT DOCUMENTS

| | | |
|---|---|---|
| CN | 107767907 | 3/2018 |
| JP | H1117025 | 1/1999 |
| KR | 20150071732 | 6/2015 |

OTHER PUBLICATIONS

International Search Report and Written Opinion for related PCT Application No. PCT/US2019/047497, dated Dec. 10, 2019, 13 pages.

(Continued)

*Primary Examiner* — Hoai V Ho
(74) *Attorney, Agent, or Firm* — Brooks, Cameron & Huebsch, PLLC

(57) ABSTRACT

An example apparatus comprises an array of memory cells coupled to sensing circuitry including a first sense amplifier, a second sense amplifier, and a logical operation component. The sensing circuitry may be controlled to sense, via first sense amplifier, a data value stored in a first memory cell of the array, sense, via a second sense amplifier, a data value stored in a second memory cell of the array, and operate the logical operation component to output a logical operation result based on the data value stored in the first sense amplifier and the data value stored in the second sense amplifier.

20 Claims, 7 Drawing Sheets

(56) References Cited

U.S. PATENT DOCUMENTS

| | | | |
|---|---|---|---|
| 8,379,433 B2 | 2/2013 | Houston et al. | |
| 9,672,895 B2 | 6/2017 | Antonyan | |
| 10,008,502 B2 | 6/2018 | Endo | |
| 10,388,364 B2 | 8/2019 | Ishizu et al. | |
| 2005/0237786 A1 | 10/2005 | Atwood et al. | |
| 2007/0159215 A1* | 7/2007 | Deng | H03F 3/45183 327/55 |
| 2008/0195887 A1 | 8/2008 | Luk et al. | |
| 2009/0141537 A1* | 6/2009 | Arsovski | G11C 7/1006 365/154 |
| 2011/0026323 A1 | 2/2011 | Luk et al. | |
| 2011/0267883 A1 | 11/2011 | Lee et al. | |
| 2012/0140540 A1 | 6/2012 | Agam et al. | |
| 2012/0243283 A1 | 9/2012 | Akerib et al. | |
| 2013/0308364 A1 | 11/2013 | Smith | |
| 2014/0250279 A1 | 9/2014 | Manning | |
| 2014/0374747 A1 | 12/2014 | Kurokawa | |
| 2015/0357008 A1 | 12/2015 | Moschiano | |
| 2016/0196142 A1 | 7/2016 | Wheeler et al. | |
| 2016/0209462 A1* | 7/2016 | Choi | G01R 31/3171 |
| 2017/0263306 A1 | 9/2017 | Murphy et al. | |
| 2017/0301379 A1* | 10/2017 | Hush | G11C 7/1006 |
| 2017/0323674 A1 | 11/2017 | Kang | |
| 2018/0025757 A1 | 1/2018 | Chan et al. | |
| 2018/0075892 A1* | 3/2018 | Nakatsuka | G11C 11/1655 |
| 2018/0075900 A1* | 3/2018 | Ishizu | G11C 16/24 |
| 2018/0122456 A1 | 5/2018 | Li et al. | |
| 2018/0144779 A1 | 5/2018 | Willcock et al. | |

OTHER PUBLICATIONS

Extended Search Report from related European Patent Application No. 19858156.3, dated Apr. 25, 2022, 12 pages.

* cited by examiner

| ROW 1 | ROW 2 | NOR | NAND | XOR |
|---|---|---|---|---|
| 0 | 0 | 1 | 1 | 0 |
| 0 | 1 | 0 | 1 | 1 |
| 1 | 0 | 0 | 1 | 1 |
| 1 | 1 | 0 | 0 | 0 |

US 11,508,431 B2

LOGICAL OPERATIONS USING A LOGICAL OPERATION COMPONENT

PRIORITY INFORMATION

This application is a Divisional of U.S. application Ser. No. 16/120,739, filed Sep. 4, 2018, which issues as U.S. Pat. No. 10,755,766 on Aug. 25, 2020, the contents of which are included herein by reference.

TECHNICAL FIELD

The present disclosure relates generally to semiconductor memory and methods, and more particularly, to apparatuses and methods related to logical operations using a logical operation component.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Data movement between and within arrays and/or subarrays of various memory devices, can affect processing time and/or power consumption.

DETAILED DESCRIPTION

Figure 1:
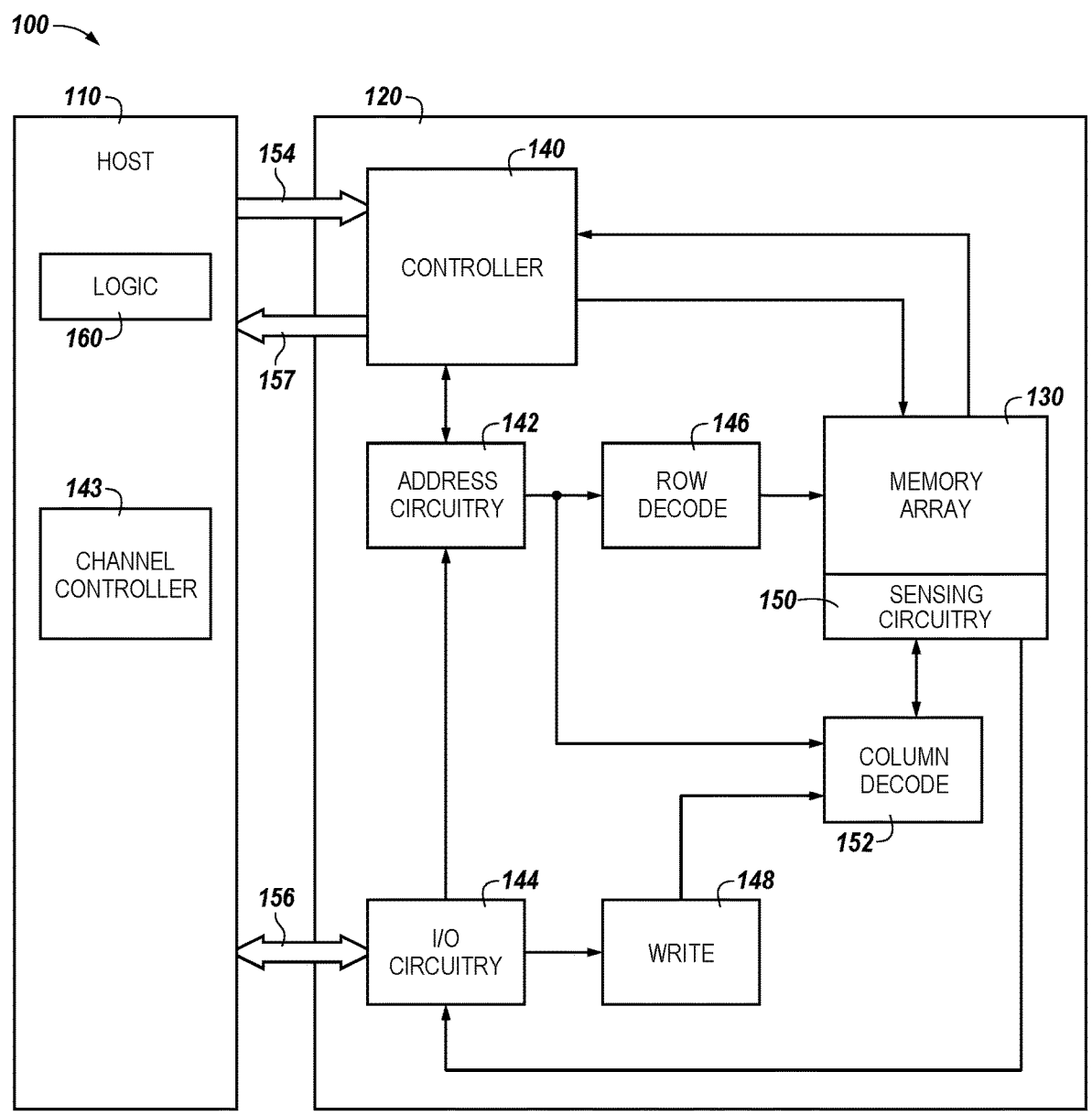
FIG. 1 is a block diagram of an apparatus in the form of a computing system including a memory device in accordance with a number of embodiments of the present disclosure.

The present disclosure includes apparatuses and methods related to logical operations using a logical operation component. An example apparatus comprises an array of memory cells coupled to sensing circuitry including a first sense amplifier, a second sense amplifier, and a logical operation component. The sensing circuitry may be controlled to sense, via first sense amplifier, a data value stored in a first memory cell of the array, sense, via a second sense amplifier, a data value stored in a second memory cell of the array, and operate the logical operation component to output a logical operation result based on the data value stored in the first sense amplifier and the data value stored in the second sense amplifier.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processing resource may be implemented internal and/or near to a memory (e.g., directly on a same chip as the memory array). A PIM device may reduce time in processing and may also conserve power. Data movement between and within arrays and/or subarrays of various memory devices, such as PIM devices, can affect processing time and/or power consumption.

Dynamic random-access memory (DRAM) may be provided as part of a computing system to store data associated with the computing system. In some approaches, DRAM may comprise multiple one transistor, one capacitor (1T1C) memory cells, which may be coupled together to form a memory array. In 1T1C DRAM environments, binary data information may be stored in the capacitor in the form of an electric charge. Once a 1T1C memory cell has been read (e.g., once a read operation has been performed using data stored in the 1T1C memory cell), the electric charge corresponding to the binary data information stored in the capacitor may discharge (e.g., leak, become depleted, etc.) thereby destroying the binary data information that was stored in the capacitor. This phenomenon may be referred to as a "destructive read" or "destructive memory cell read."

In contrast, DRAM memory cells having three transistors (3T) may preserve the binary data information (e.g., may preserve the charge stored therein) subsequent to performance of a read operation. This may allow for multiple word lines (e.g., read row lines, write row lines, etc.) to be fired without the need to refresh the memory cells or re-write data to the memory cells subsequent to performance of a read operation. This may reduce power consumption of a memory device since the memory cells do not need to be re-written or refreshed in comparison to conventional 1T1C DRAM memory cells, and may reduce an amount of time (e.g., a read-to-read delay) required between performance of read operations in comparison to conventional 1T1C DRAM memory cells.

In some approaches, performing logical operations between binary data (e.g., operands) stored in memory cells and binary data stored in an accumulator may need to be inverted (e.g., using a latch in addition to a sense amplifier latch) prior to performance of a logical operation. For example, in some approaches, data would be transferred to a first latch to be inverted, and the inverted data stored in the first latch may have been used as an operand in a logical operation between the inverted operands and operands stored in an accumulator.

Further, in some approaches, performing logical operations between binary data (e.g., operands) stored in memory cells and binary data stored in an accumulator may require multiple latches per column because binary data may need to be transferred multiple times prior to execution of a logical operation. For example, data stored in memory cells may be transferred to a first latch, then data may be transferred to a second latch in two discrete operations prior to performance of a logical operation using the data values.

In contrast, embodiments disclosed herein allow for logical operations to be performed between binary data (e.g., operands) stored in the memory cells without using an additional latch to perform the inversion. For example, a 3T memory cell may be controlled to invert the data stored therein without the need for an additional latch. In some embodiments, the inverted data associated with the 3T memory cell may then be used as an operand for a logical operation.

Further, in some embodiments, logical operations may be performed between binary data stored in sense amplifiers without performing multiple operations to transfer the data from memory cells to the sense amplifiers. For example, in some embodiments, data values may be concurrently transferred from memory cells to multiple sense amplifiers. Subsequent to transfer of the data, logical operations may be performed using the data values stored in the sense amplifiers. In some embodiments, performance of the logical operation may be facilitated through the use of a logical operation component, which may be configured to cause performance of a logical operation such as an XOR logical operation between the data values stored in the sense amplifiers.

Some embodiments herein may allow for logical operations such as NOR logical operations and/or NAND logical operations to be performed using two sense amplifiers with different reference voltages. For example, a pair of sense amplifiers having different reference voltages (e.g., trip points) can be operated to perform a NOR operation or a NAND operation depending on which sense amplifier of the pair of sense amplifiers is enabled. As described in more detail herein, a logical operation component coupled to the pair of sense amplifiers can be operated such that the sensing circuitry outputs a XOR of the data values stored in the sense amplifiers, which can correspond to a XOR operation between data values stored in a pair of cells sensed by the sense amplifiers.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n, "N," etc., particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 350 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array (e.g., a 3T DRAM array), SRAM array, STT RAM array, PCRAM array, TRAM array, RRAM array, NAND flash array, and/or NOR flash array, for instance. The array 130 can comprise memory cells arranged in rows coupled by word lines, which may be referred to herein as row lines, access lines, or select lines, and columns coupled by digit lines, which may be referred to herein as data lines or sense lines. Although a single array 130 is shown in FIG. 1, embodiments are not so limited. For instance, memory device 120 may include a number of arrays 130 (e.g., a number of banks of DRAM cells, NAND flash cells, etc.). In some embodiments, the memory array may include the sensing circuitry 150 in addition to the memory cells arranged in rows coupled by word lines and columns coupled by digit lines.

The memory device 120 includes address circuitry 142 to latch address signals for data provided over a data bus 156 (e.g., an I/O bus) through I/O circuitry 144. Status and/or exception information can be provided from the controller 140 on the memory device 120 to a channel controller 143, through a high speed interface (HSI) including an out-of-band bus 157, which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

Controller 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine, sequencer, or some other type of controller, and include hardware and/or firmware (e.g., microcode instructions) in the form of an application specific integrated circuit (ASIC), field programmable gate array, etc. The controller 140 can control, for example, performance of logical operations between operands stored in the memory array 130.

As described further below, in a number of embodiments, the sensing circuitry 150 and/or the array 130 can comprise one or more sense amplifiers and/or a logical operation component. The sense amplifier(s) can be used in the performance of logical operations. For example, the sense amplifiers and/or the logical operation component may be used to perform logical operations such as XOR, NOR, NAND, etc. logical operation between operands stored in the sense amplifier(s). Embodiments are not so limited, however, and in some embodiments, the sense amplifiers may be configured to latch data values corresponding to NOR and/or NAND operations based on the reference voltages (e.g., trip points) of the sense amplifiers.

For example, as described herein, a first sense amplifier may be configured to latch a data value corresponding to a NOR of a data value stored in a memory array coupled to the first sense amplifier, while a second sense amplifier may be configured to latch a data value corresponding to a NAND of a data value stored in the memory array coupled to the second sense amplifier. The data values latched in the first sense amplifier and/or the second sense amplifier may be transferred back the memory array. In some embodiments, the data values latched in the first and second sense amplifiers may be used as operands by a logical operation component to output a XOR.

In a number of embodiments, the sensing circuitry 150 can be used to perform logical operations using data stored in array 130 as inputs and/or store the results of the logical operations back to the array 130 without transferring data via a digit line address access (e.g., without firing a column decode signal). As such, various compute functions can be performed using, and within, sensing circuitry 150 rather than (or in association with) being performed by processing resources external to the sensing circuitry (e.g., by a processing resource associated with host 110 and/or other processing circuitry, such as ALU circuitry, located on device 120 (e.g., on controller 140 or elsewhere)). Stated alternatively, various logical operations may be performed using, and within, the sensing circuitry 150 without transferring data or commands to or from the host 110.

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array.

In a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to complement and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register).

Figure 2A:
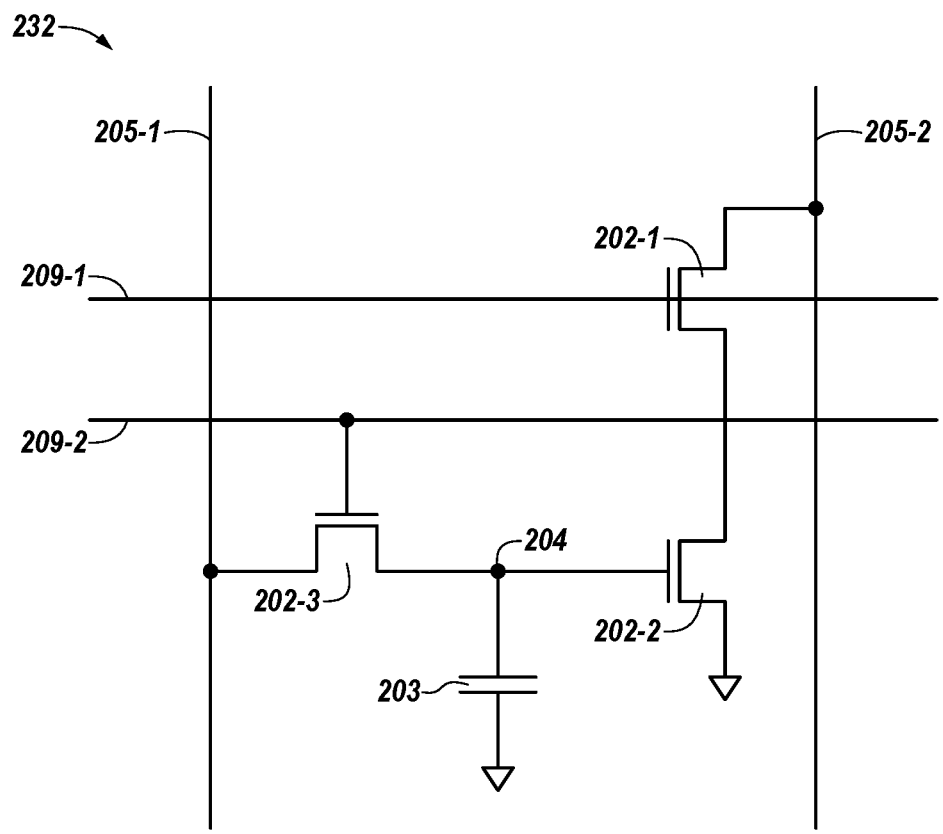
FIG. 2A is a schematic drawing illustrating a portion of a memory array in accordance with a number of embodiments of the present disclosure.

FIG. 2A is a schematic drawing illustrating a portion of a memory array in accordance with a number of embodiments of the present disclosure. FIG. 2A illustrates one memory cell 232, which can be one of a number of memory cells corresponding to memory array 130 shown in FIG. 1. In the example shown in FIG. 2, the memory cell 232 is a 3T DRAM memory cell. In this example, the memory cell 232 comprises three transistors 202-1, 202-2, and 202-3. The memory cell 232 may be operated to store a data value (e.g., a stored charge at node 204). In some embodiments, a charge associated with the data value may be stored at node 204 using the parasitic capacitance generated between transistor 202-3 and transistor 203-2. Embodiments are not so limited; however, and the memory cell 232 may optionally include a discrete capacitor 203 to store the data value.

The memory cell 232 includes two word lines 209-1/209-2 (e.g., row lines) and two digit lines 205-1/205-2 (e.g., bit lines). Word line 209-1 may be referred to herein as a read row line, and the word line 209-2 may be referred to herein as a write row line. Digit line 205-1 may be referred to herein as a write digit line, and digit line 205-2 may be referred to herein as a read digit line. The word lines 209-1/209-2 and the digit lines 205-1/205-2 may be enabled and/or disabled in conjunction with reading and writing data to the node 204 of the memory cell 232.

As shown in FIG. 2A, the transistors 203-2, 203-2, and 203-3 are coupled to the word lines 209-1/209-2 and digit lines 205-1/205-2. In association with performing a write operation, the write row line 209-2 may be enabled, and data may be placed on the write digit line 205-1, thereby causing the data to be stored at node 204. Similarly, in association with performing a read operation, the read row line 209-1 may be enabled and the data may be transferred out of the node 204 via the read digit line 205-2. In some embodiments, the data value read out of the memory cell 232 as part of a read operation may be inverted in comparison to the data value written to the memory cell 232 as part of the write operation. For example, if a value of "1" is written to the memory cell 232, a value of "0" may be read out of the memory cell 232. Conversely, if a value of "0" is written to the memory cell 232, a value of "1" may be read out of the memory cell 232.

For example, memory cell 232 can be coupled to different digit lines 205-1/205-2 and word lines 209-1/209-2. For instance, in this example, a first source/drain region of transistor 202-3 is coupled to digit line 205-1, a second source/drain region of transistor 202-3 is coupled to node 204, and a gate of transistor 202-3 is coupled to word line 209-2. A first source/drain region of transistor 202-1 is coupled to digit line 205-2, a second source/drain region of transistor 202-1 is coupled to a first source/drain region of transistor 202-2, and a gate of transistor 202-1 is coupled to word line 209-1.

In some embodiments, the data value stored at node 204 of the memory cell 232 may be used as an operand for performance of a logical operation. For example, a data value stored at node 204 of the memory cell 232 may be used as an operand to perform a logical operation with a data value stored at node 204 of a different memory cell, as described in more detail in association with FIGS. 3-5. For example, the data value stored at node 204 of the memory cell 232 may be transferred to a sense amplifier and subsequently used as an operand to perform a logical operation with a data value stored at node 204 of a different memory cell and transferred to a different sense amplifier. In some embodiments, the logical operation may comprise an XOR operation; however, embodiments are not so limited, and various logical operations such as ANDS, ORs, XORs, NANDs, etc. operations may be performed in the manner described herein.

In some embodiments, the memory cell 232 may be controlled to store a data value at node 204 subsequent to performance of a read operation. For example, the memory cell 232 may be controlled such that read operations are non-destructive. This may allow for multiple rows (e.g., read rows) to be fired without refreshing or re-writing data to the memory cell 232, which may allow for improved performance and reduced power consumption in comparison with previous approaches that utilize destructive read cells such as 1T1C memory cells.

Although schematically represented in a planar orientation, the transistors 202-1, 202-2, and/or 202-3 may be arranged in a vertical orientation (e.g., extending upward out of the page or downward into the page in FIG. 2). In some embodiments, the transistors 202-1, 202-2, and/or 202-3 of the memory cell 232 may be formed such that the transistors 202-1, 202-2, and/or 202-3 are contained within an area defined by the digit lines 205-1/205-2. For example, the transistors 202-1, 202-2, and/or 202-3 of the memory cell 232 may be formed on pitch with digit lines 205-1/205-2 of the memory cell 232. In some embodiments, the memory cell 232 may be formed such that the transistors 202-1, 202-2, and/or 202-3 of the memory cell 232 are disposed within an area that equal to or less than an area used by a conventional 1T1C DRAM memory cell.

Figure 2B:
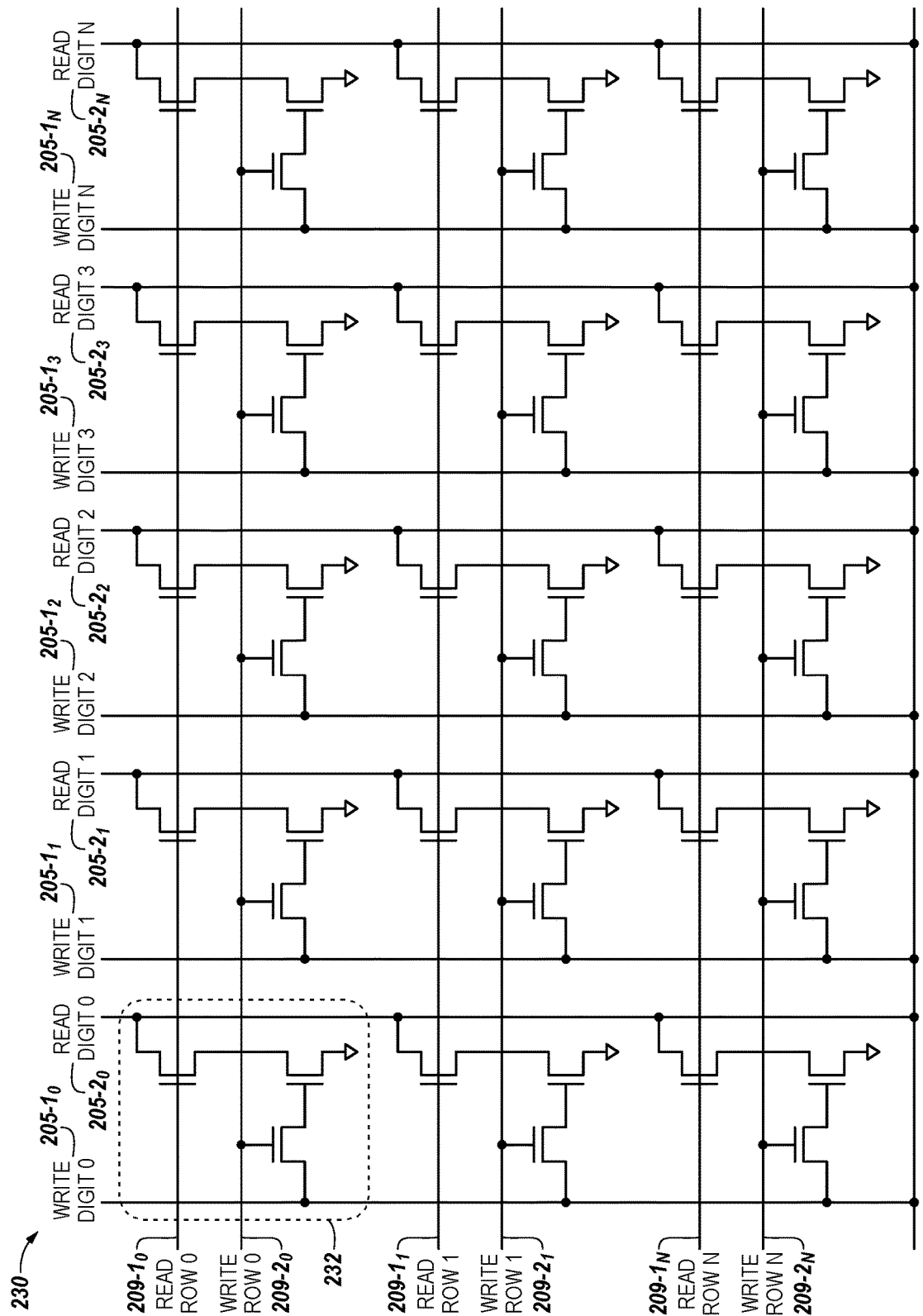
FIG. 2B is another schematic drawing illustrating a portion of a memory array in accordance with a number of embodiments of the present disclosure.

FIG. 2B is another schematic drawing illustrating a portion of a memory array 230 in accordance with a number of embodiments of the present disclosure. As shown in FIG. 2B, the memory array 230 comprises a plurality of memory cells 232. For clarity, only one memory cell 232 is labeled in FIG. 2B; however, each set of three transistors illustrated in FIG. 2B represents one of a plurality of memory cells 232 associated with the memory array 230.

A plurality of memory cells 232 are coupled to a plurality of digit lines 205 and row lines 209. For example, a first memory cell 232 is coupled to digit lines $205\text{-}1_0/205\text{-}2_0$ (e.g., write digit0 line $205\text{-}1_0$ and read digit0 line $205\text{-}2_0$) and row lines $209\text{-}1_0/209\text{-}2_0$ (e.g., read row0 line $209\text{-}1_0$ and write row0 line $209\text{-}2_0$). Similarly, a second memory cell is coupled to digit lines $205\text{-}1_1/205\text{-}2_1$ (e.g., write digit1 line $205\text{-}1_1$ and read digit1 line $205\text{-}2_1$) and word lines $209\text{-}1_0/209\text{-}2_0$ (e.g., read row0 line $209\text{-}1_0$ and write row0 line $209\text{-}2_0$), a third memory cell is coupled to digit lines $205\text{-}1_0/205\text{-}2_0$ (e.g., write digit0 line $205\text{-}1_0$ and read digit0 line $205\text{-}2_0$) and word lines $209\text{-}1_1/209\text{-}2_1$ (e.g., read row1 line $209\text{-}1_1$ and write row1 line $209\text{-}2_1$, etc.

In some embodiments, if one or more memory cells 232 coupled to a particular digit line $205\text{-}2_0, \ldots 205\text{-}2_N$ (e.g., if one or more memory cells in a particular column of memory cells) contains a high voltage (e.g., a logical value of "1"), the associated digit line $205\text{-}2_0, \ldots 205\text{-}2_N$ will be driven to a ground reference potential. For example, if memory cell 232 (or any other memory cell in the column of memory cells coupled to digit line $205\text{-}2_0$) contains a high voltage, digit line $205\text{-}2_0$ will be driven to a ground reference potential.

Figure 3:
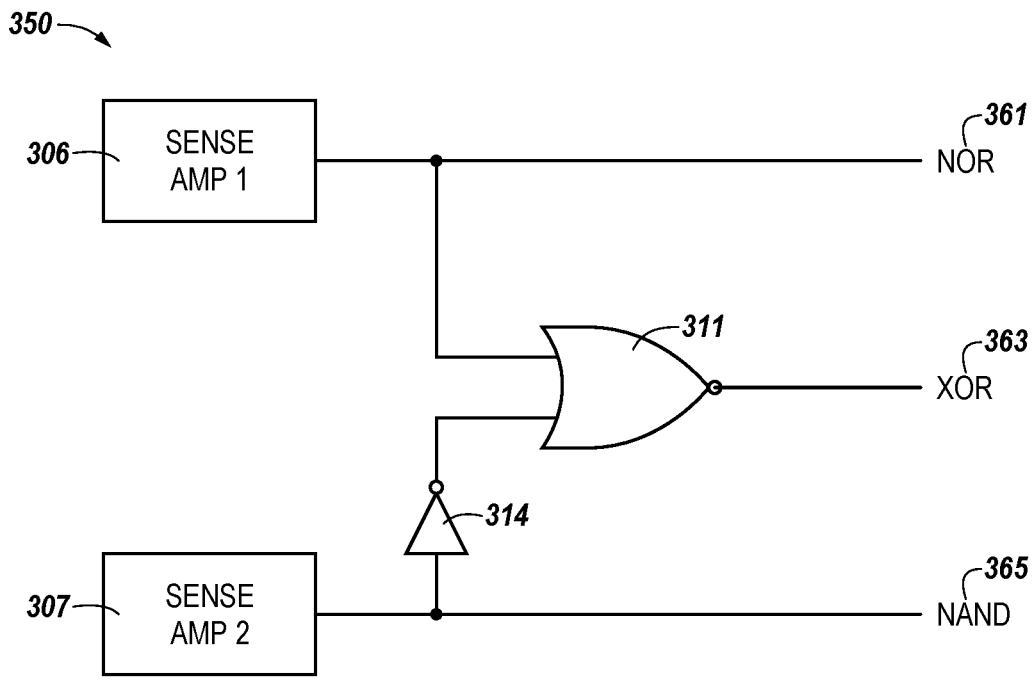
FIG. 3 is a block diagram of sensing circuitry in accordance with a number of embodiments of the present disclosure.

As described in more detail in association with FIG. 3, herein, a sense amplifier (e.g., sense amplifier 306 illustrated in FIG. 3) is coupled to respective pairs of digit lines 205-1$_0$, . . . 205-1$_N$ and 205-2$_0$, . . . 205-2$_N$. The sense amplifier may sense a low voltage (e.g., a logical value of "0") if one or more of the memory cells coupled to a same pair of digit lines 205-1$_0$, . . . 205-1$_N$ and 205-2$_0$, . . . 205-2$_N$ that are also coupled to the sense amplifier contains a high voltage (e.g., a logical value of "1"). Conversely, the sense amplifier may sense a high voltage (e.g., a logical value of "1") if one or more of the memory cells coupled to a same pair of digit lines 205-1$_0$, . . . 205-1$_N$ and 205-2$_0$, . . . 205-2$_N$ that are also coupled to the sense amplifier contains a low voltage (e.g., a logical value of "0"). That is, in some embodiments, the sense amplifier may sense a particular value (e.g., a "1" or a "0") based on the value stored in the memory cell that is coupled thereto.

As mentioned above, because a read operation using the memory cell 232 described in FIGS. 2A and 2B may be non-destructive, the memory cell 232 may still contain the original data value (e.g., the same high or low voltage) that was stored therein prior to performance of the read operation and/or performance of the logical operation, while the sense amplifier may contain a result of the logical operation after performance of the logical operation. In some embodiments, the data value (e.g., the logical value of "0" or "1") stored in the sense amplifier subsequent to performance of the logical operation may be written back to any memory cell 232 (or row of memory cells) in the memory array 230, as described in more detail in association with FIG. 3, herein.

FIG. 3 is a block diagram of sensing circuitry in accordance with a number of embodiments of the present disclosure. As shown in FIG. 3, the sensing circuitry 350 may include a first sense amplifier (SENSE AMP1) 306, a second sense amplifier (SENSE AMP2) 307, and a logical operation component 311. As shown in FIG. 3, the logical operation component 311 is an exclusive or (XOR) logical operation component. For example, the logical operation component 311 may be configured to cause performance of an XOR 363 logical operation between an operand (e.g., a data value or charge corresponding to a logical "1" or "0") stored in the first sense amplifier 306 and an operand stored in the second sense amplifier 307. In some examples, as described in more detail in connection with FIG. 4, herein, the first sense amplifier 306 may have a reference voltage (e.g., a trip point) associated therewith that causes a logical NOR of the data value to be stored in the first sense amplifier 306, while the second sense amplifier 307 may have a reference voltage associated therewith that causes a logical NAND of the data value to be stored in the second sense amplifier 307. The logical operation component 311 is described in more detail in connection with FIG. 5, herein.

As used herein, a "component" is an electrical circuit (e.g., circuitry), hardware device (e.g., one or more processing resources and/or one or more memory resources), logic device, application-specific integrated circuit, field-programmable gate array, or combinations thereof, to perform one or more tasks or functions. A "logical operation component" is a component configured to cause performance of a logical operation, such as a XOR logical operation.

The first sense amplifier 306 and may be coupled to the logical operation component 311, and the second sense amplifier 307 may be coupled to the logical operation component 311. In some embodiments, the second sense amplifier 307 may be coupled to the logical operation component 311 via an inverter 314. The inverter 314 may, in some embodiments, function as a NOT gate. When the logical operation component 311 is invoked, performance of a XOR logical operation between an operand stored in the first sense amplifier 306 and an operand stored in the second sense amplifier 307 may be facilitated.

As discussed in further detail in connection with FIG. 7, herein, in some embodiments, the sensing circuitry 350 may be configured to store a data value corresponding to a logical NOR of a data value stored in a memory cell (e.g., memory cell 232 illustrated in FIG. 2, herein) to be stored in the first sense amplifier 306, and/or the sensing circuitry 350 may be configured to store a data value corresponding to a logical NAND of a data value stored in a memory cell to be stored in the second sense amplifier 307. For example, if the data value stored in the first sense amplifier 306 is not passed through the logical operation component 311, the sensing circuitry 350 may be configured to output a data value corresponding to a NOR 361 logical operation from the first sense amplifier 306. Similarly, if the data value stored in the second sense amplifier 307 is not passed through the logical operation component 311, the sensing circuitry 350 may be configured to output a data value corresponding to a NAND 365 logical operation from the second sense amplifier 307. In some embodiments, the data value corresponding to the NOR logical operation 361, the XOR logical operation 363, and/or the NAND logical operation 365 may be read from the first sense amplifier 306 and/or the second amplifier 307 by enabling a column select line (e.g., Column Select transistor 534 illustrated in FIG. 5, herein).

Figure 4:
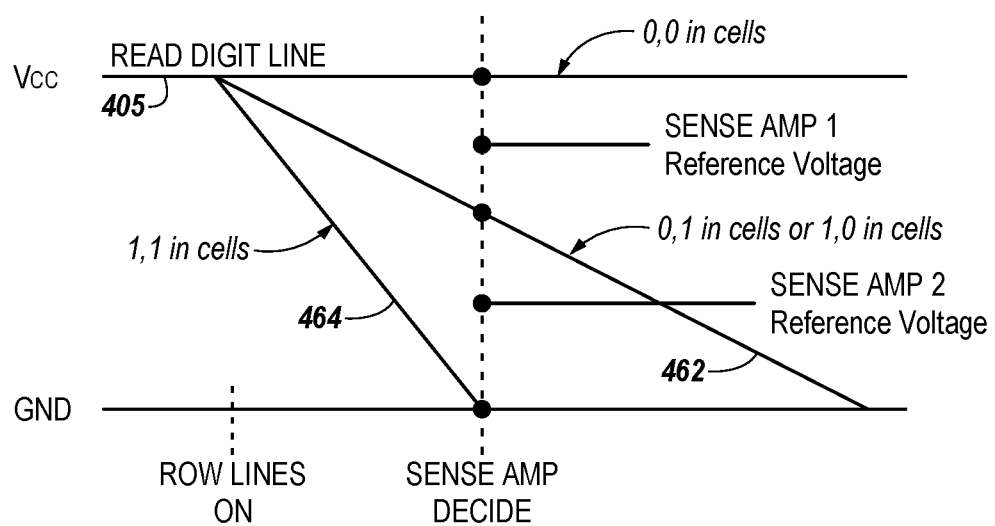
FIG. 4 is a graph illustrating the behavior of a plurality of digit lines responsive to activation of row lines associated with sensing circuitry in accordance with a number of embodiments of the present disclosure.

FIG. 4 is a graph illustrating the behavior of a plurality of digit lines responsive to activation of row lines associated with sensing circuitry in accordance with a number of embodiments of the present disclosure. The graph illustrated in FIG. 4 may correspond to a voltage sensing scheme associated with sensing circuitry (e.g., sensing circuitry 550 illustrated in FIG. 5, herein). The upper horizontal curve shown in FIG. 4 corresponds to a voltage magnitude of $V_{cc}$, while the lower horizontal curve shown in FIG. 4 corresponds to a voltage magnitude associated with a ground reference potential (Gnd).

As shown in FIG. 4, one or more sense amplifiers (e.g., SENSE AMP1 and/or SENSE AMP2 illustrated in FIG. 3, herein) may be activated. The sense amplifier(s) may have a reference voltage (e.g., a trip point) somewhere between a pair of rail voltages (e.g., a supply voltage Vcc and applied to the read digit line 405 and the diagonal curve(s) illustrated in FIG. 4.

For example, upon activation (e.g., upon enabling) of a first sense amplifier (e.g., SENSE AMP1 illustrated in FIG. 3, herein), the first sense amplifier may have a reference voltage somewhere in between $V_{cc}$ and the diagonal curve corresponding to a voltage associated with the first sense amplifier (e.g., the SENSE AMP1 Reference Voltage shown in FIG. 4). Similarly, upon activation of a second sense amplifier (e.g., SENSE AMP2 illustrated in FIG. 3, herein), the second sense amplifier may have a reference voltage somewhere in between $V_{cc}$ and the diagonal curve corresponding to a voltage associated with the second sense amplifier (e.g., the SENSE AMP2 Reference Voltage shown in FIG. 4).

In some embodiments, the first sense amplifier and the second sense amplifier may each have a different reference voltage (e.g., trip point). The reference voltage may refer to a voltage at which at least one memory cell associated with the sense amplifier is conducting. For example, the first sense amplifier may be configured to have a reference voltage corresponding to a first voltage and the second sense amplifier may be configured to have a reference voltage corresponding to a second voltage. The first voltage may have a greater magnitude than the second voltage, or vice versa.

FIG. 4 illustrates an example in which two row lines are activated. When two row lines are activated, there may be three different cases for how the digit lines (e.g., digit lines 205-1 and 205-2 illustrated in FIG. 2, herein) respond. The first case corresponds to a case in which both memory cells coupled to the row lines contain a logical value of "0" (as shown at "0,0 in cells"). In this case, the read digit line (e.g., read digit lines 205-2 illustrated in FIG. 2, herein) stay at a precharged level of $V_{cc}$. For example, in the first case, the reference voltages of the sense amplifiers may be selected such that, after a particular amount of time (e.g., at the point labeled SENSE AMP DECIDE), neither of the sense amplifiers are "tripped" corresponding to the memory cells coupled to the row lines contain logical values of "0."

The second case corresponds to a case in which one of the memory cells contains a logical value of "1" and the other memory cell contains a logical value of "0" (as shown at "0,1 in cells or 1,0 in cells). In this case the read digit line may discharge from $V_{cc}$ to the ground reference potential as shown by the curve 462. For example, in the second case, the reference voltages of the sense amplifiers may be selected such that, after a particular amount of time (e.g., at the point labeled SENSE AMP DECIDE), one of the sense amplifiers is "tripped" corresponding to one of the memory cells coupled to the row lines containing a logical value of "0," while another memory cell coupled to the row lines contains a logical value of "1."

In the second case, the data value latched by the first sense amplifier in response to the sense amplifier being tripped may correspond to a logical NOR (or NAND) of the data value stored in the corresponding memory cell. Similarly, the data value latched by the second sense amplifier may correspond to a logical NAND (or NOR) of the data value stored in the corresponding memory cell. Whether the data value latched by the respective sense amplifier corresponds to a logical NOR or a logical NAND corresponds to the reference voltage associated with the sense amplifier that is tripped.

For example, as shown in FIG. 4, the SENSE AMP1 Reference Voltage is higher than a voltage corresponding a voltage on the READ DIGIT LINE at a time corresponding to the SENSE AMP DECIDE curve, which may result in the first sense amplifier latching a data value corresponding to a logical NOR of a data value stored in the memory cell corresponding to the first sense amplifier. In contrast, the SENSE AMP2 Reference Voltage is lower than a voltage corresponding a voltage on the READ DIGIT LINE at a time corresponding to the SENSE AMP DECIDE curve, which may result in the second sense amplifier latching a data value corresponding to a logical NAND of a data value stored in the memory cell corresponding to the second sense amplifier.

The third case corresponds to a case in which both memory cells contain a logical value of "1" (as shown at "1,1 in cells"). In this case, the read digit line may discharge from $V_{cc}$ to the ground reference potential as shown by the curve 464. For example, in the third case, the reference voltages of the sense amplifiers may be selected such that, after a particular amount of time (e.g., at the point labeled SENSE AMP DECIDE), both of the sense amplifiers are "tripped" responsive to the memory cells coupled to the row lines containing a logical value of "1." In some embodiments, the rate of discharge exhibited by the curve 464 may be twice the rate of discharge exhibited by the curve 462. For example, in the case corresponding to the curve 464, there may be twice as much current in the memory cells as there is in the case corresponding to the curve 462.

In some embodiments, a reference voltage for the first sense amplifier may be set to a particular value (as shown at "SENSE AMP1 Reference Voltage"), and/or a reference voltage for the second sense amplifier may be set to a different particular value (as shown at "SENSE AMP2 Reference Voltage"). Embodiments are not limited to the case shown in FIG. 4 in which there are two sense amplifiers, however, and in some embodiments, a single sense amplifier may be used. In examples in which a single sense amplifier is used, the sense amplifier may be sensed twice to correspond to the two particular sense amplifier reference voltage levels illustrated in FIG. 4.

For example, a first reference voltage may be set for a single sense amplifier and a data value may be latched by the sense amplifier. In some embodiments, the data value latched by the sense amplifier using the first reference voltage may correspond to a logical NOR of a data value stored in the memory cell corresponding to the sense amplifier. Subsequently, a second reference voltage may be set for the sense amplifier. A data value latched by the sense amplifier using the second reference voltage may correspond to a logical NAND of a data value stored in the memory cell corresponding to the sense amplifier. The data value corresponding to the logical NOR and/or the data value corresponding to the logical NAND may be transferred to a storage location for use in a subsequent logical operation (e.g., in performance of a XOR logical operation using the data value corresponding to the NOR and the data value corresponding to the NAND as operands for the XOR logical operation).

Figure 5:
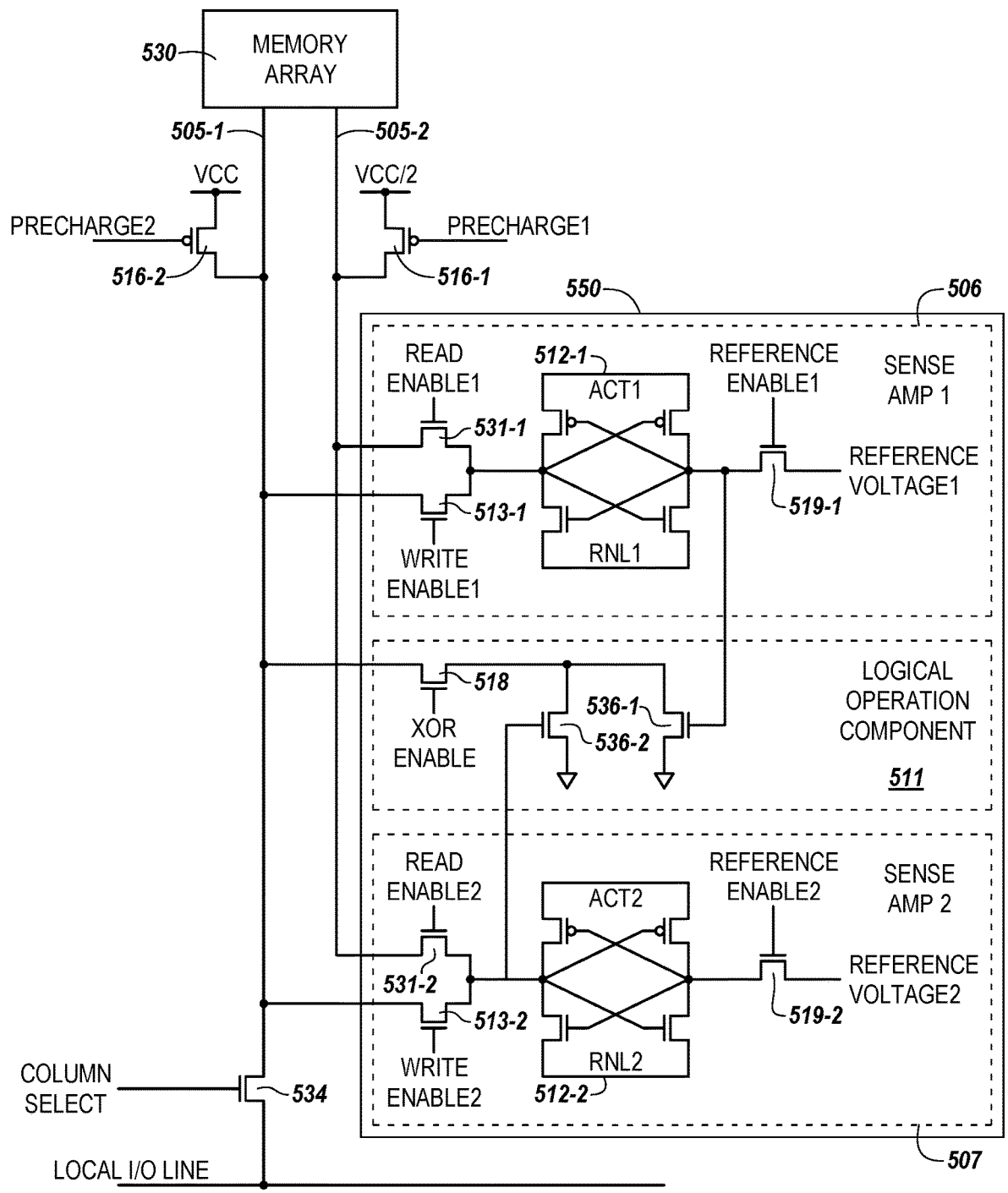
FIG. 5 is a schematic diagram illustrating sensing circuitry having a logical operation component in accordance with a number of embodiments of the present disclosure.

FIG. 5 is a schematic diagram illustrating sensing circuitry having a logical operation component in accordance with a number of embodiments of the present disclosure. FIG. 5 illustrates a first sense amplifier 506 (e.g., SENSE AMP1), a second sense amplifier 507 (e.g., SENSE AMP2), and a logical operation component 511. FIG. 5 illustrates one sensing component 550 which can be one of a number of sensing components corresponding to sensing circuitry 150 shown in FIG. 1. The sensing component 550 may be coupled to a memory array 530, via the digit line 505-2 (e.g., read digit line 505-2) and the digit line 505-1 (e.g., write digit line 505-1).

The read digit line 505-2 may be coupled to a first source/drain region of a transistor 516-1 (e.g., Precharge1 transistor 516-1). A second source/drain region of the transistor 516-1 may be coupled to a voltage source configured to provide $V_{cc}/2$ to the second source/drain region of the transistor 516-1. The write digit line 505-1 may be coupled to a first source/drain region of a transistor 516-2 (e.g., Precharge2 transistor 516-2). A second source/drain region of the transistor 516-2 may be coupled to a voltage source configured to provide $V_{cc}$ to the second source/drain region of the transistor 516-2.

As described in more detail below, the read digit line 505-2 and the write digit line 505-1 may be coupled to the sensing circuitry 550, a Column Select transistor 534, and/or a Local input/output (I/O) line. The Column Select transistor 534 may be controlled to select various columns of the memory array 530 to, for example, allow data values to be transferred between the memory array 530 and the sensing circuitry 550 and/or to circuitry external to the memory array 550. In some embodiments, the Local I/O line may be controlled to transfer data values from the memory array 530 and/or sensing circuitry 550 to circuitry external to the memory array 530.

The sense amplifiers 506 and 507 can be operated to determine a data value (e.g., logic state) stored in a selected memory cell of the memory array 530. The sense amplifiers 506 and 507 can each include a cross-coupled latch 512-1/ 512-2 (e.g., gates of a pair of transistors, such as n-channel transistors that are cross coupled with the gates of another pair of transistors, such as p-channel transistors); however, embodiments are not limited to this example.

The cross-coupled latch 512-1 of SENSE AMP1 506 may be coupled to a Read Enable1 transistor 531-1, which may be coupled to the read digit line 505-2 and a Write Enable1 transistor 513-1, which may be coupled to the write digit line 505-1. Similarly, the cross-coupled latch 512-2 of SENSE AMP2 507 may be coupled to a Read Enable2 transistor 531-2, which may be coupled to the read digit line 505-2 and a Write Enable2 transistor 513-2, which may be coupled to the write digit line 505-1.

The sensing circuitry 506 may further include a Reference Enable1 transistor 519-1, which may be coupled to the cross-coupled latch 512-1 at a first source/drain region of the transistor 519-1. In some embodiments, a second source/drain region of the transistor 519-1 may be coupled to a reference potential (e.g., a ground reference potential). Similarly, the sensing circuitry 507 may further include a Reference Enable2 transistor 519-2, which may be coupled to the cross-coupled latch 512-2 at a first source/drain region of the transistor 519-2. In some embodiments, a second source/drain region of the transistor 519-2 may be coupled to a reference potential (e.g., a ground reference potential).

In some embodiments, an XOR logical operation as described above in connection with FIG. 3 and below in connection with FIGS. 7 and 8 may be performed between data values stored in the memory array 530 by precharging the ACT1 (active pull-up) node of the cross-coupled latch 512-1 of SENSE AMP1 506 and precharging the ACT2 node of the cross-coupled latch 512-2 of the SENSE AMP2 507, and/or precharging the RNL1 (activation) node of the cross-coupled latch 512-1 of SENSE AMP1 506 and precharging the RNL2 node of the cross-coupled latch 512-2 of the SENSE AMP2 507. In some embodiments, the ACT1 node, the ACT2 node, the RNL1 node, and/or the RNL2 node may be precharged to $V_{cc}/2$ prior to performance of the logical operation.

Subsequent to, or concurrently with precharging the ACT1 node, the ACT2 node, the RNL1 node, and/or the RNL2 node, the Precharge1 transistor 516-1 may be enabled to precharge the read digit line 505-2 to $V_{cc}/2$. In some embodiments, the Read Enable1 transistor 531-1 and the Read Enable2 transistor 531-2 may be enabled such that the charge on the digit line 505-2 may pass through the Read Enable1 transistor 531-1 and the Read Enable2 transistor 531-2. Subsequently, the Reference Enable1 transistor 519-1 and the Reference Enable2 transistor 519-2 may be enabled.

A plurality of rows (e.g., rows 209-1/209-2 illustrated in FIG. 2, herein) may be subsequently activated (e.g., opened). In some embodiments, two rows, such as write row0 209-2$_0$ and write row1 209-2$_1$ may be activated. The rows 209-1/209-2 may be activated to allow a data value stored in a memory cell (e.g., memory cell 232 illustrated in FIG. 2) to be transferred to the sense amplifiers 506/507 (e.g., SENSE AMP1 and/or SENSE AMP2).

In some embodiments, the data values stored in memory cells coupled to the rows (e.g., rows 209-1/209-2) may be sensed by the SENSE AMP1 and/or the SENSE AMP2. For example, a signal may develop on the SENSE AMP1 and/or the SENSE AMP2 in response to activation of the rows. Once the signal has developed on the SENSE AMP1 and/or the SENSE AMP2, the Reference Enable1 transistor 519-1 and the Reference Enable2 transistor 519-2 may be disabled, and/or the Read Enable1 transistor 531-1 and the Read Enable2 transistor 531-2 may be disabled.

The ACT1 node the ACT2 node, the RNL1 node, and/or the RNL2 node may subsequently be enabled (e.g., fired) to sense a state corresponding to the read digit line 505-2. For example, the ACT1 node the ACT2 node, the RNL1 node, and/or the RNL2 node may subsequently be enabled to sense the data values present on the read digit line 505-2 in the SENSE AMP1 506 and/or the SENSE AMP2 507.

In some embodiments, once the data values are sensed by the SENSE AMP1 and/or the SENSE AMP2, the rows may be deactivated (e.g., closed). In some embodiments, the write digit line 505-1 may be precharged to $V_{cc}$. For example, the Precharge2 transistor 516-2 may be enabled to precharge the write digit line 505-1 to $V_{cc}$. Subsequently, a row different than the rows previously activated may be activated. For example, write rowN 209-2$_N$ may be activated (e.g., opened).

The XOR Enable transistor 518 may be subsequently enabled to transfer a result of the XOR logical operation between the data value sense by SENSE AMP1 and the SENSE AMP2 to the row different than the rows previously activated (e.g., to write rowN 209-2$_N$). In some embodiments, the result of the XOR logical operation may be stored in a memory cell coupled to the write row (e.g., to a memory cell coupled to write rowN 209-2$_N$). After the result of the XOR logical operation has been transferred to the write row that is different than the rows previously activated, the write row that is different than the rows previously activated may be disabled (e.g., closed).

In some embodiments, the result of the XOR logical operation may be read out of the sensing circuitry 550 via the Column Select line and/or via the Local I/O line. As described above, the data value sensed by the SENSE AMP1 may be read out of the sensing circuitry the write row that is different than the rows previously activated, the Column Select line and/or via the Local I/O line. As described above in connection with FIG. 3, the resulting data value read out of the SENSE AMP1 may correspond to a data value having a NOR logical operation applied thereto or performed thereon. Similarly, the data value sensed by the SENSE AMP2 may be read out of the sensing circuitry the write row that is different than the rows previously activated, the Column Select line and/or via the Local I/O line. As described above in connection with FIG. 3, the resulting data value read out of the SENSE AMP2 may correspond to a data value having a NAND logical operation applied thereto or performed thereon.

Figure 6:
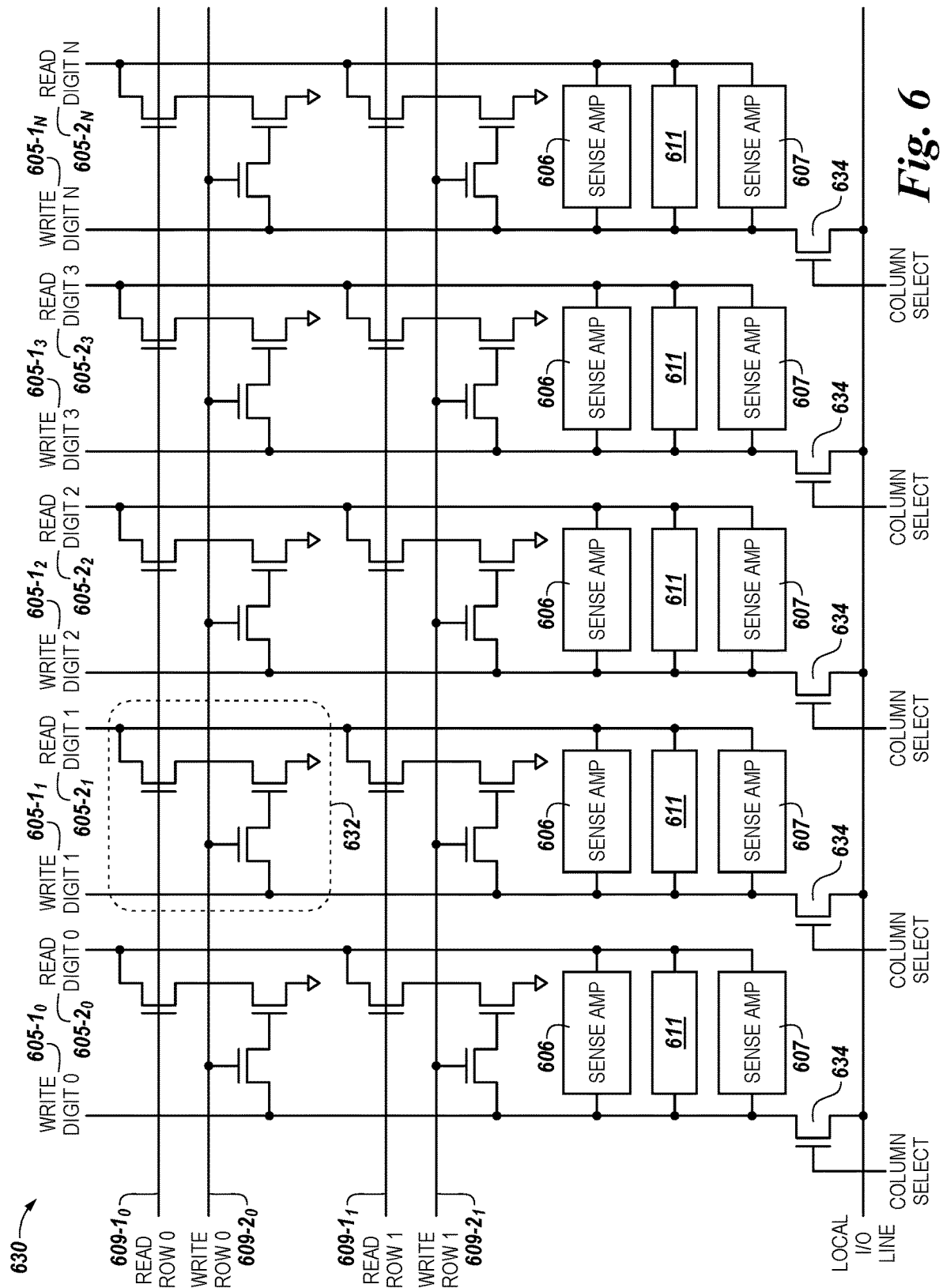
FIG. 6 is another schematic diagram illustrating a portion of memory array including sensing circuitry having a logical operation component in accordance with a number of embodiments of the present disclosure.

FIG. 6 is a schematic diagram illustrating a portion of a memory array including sensing circuitry having a logical operation component in accordance with a number of embodiments of the present disclosure. FIG. 6 shows a number of sense amplifiers 606/607 coupled to respective digit lines 605 and 605. The sense amplifiers 606/607 shown in FIG. 6 can correspond to sensing circuitry 150 shown in FIG. 1, sense amplifiers 306/307 shown in FIG. 3 and/or sense amplifiers 506/507 shown in FIG. 5.

Although not explicitly shown, memory cells, such as those described in FIG. 2B, are coupled to the respective digit lines 605-1 and 605-2 The cells of the memory array 630 can be arranged in rows coupled by word lines and columns coupled by pairs of digit lines, etc. The individual digit lines corresponding to each pair of respective digit lines can also be referred to as data lines. Although only five pairs of digit lines 605-1/605-2 (e.g., five columns) are shown in FIG. 6, embodiments of the present disclosure are not so limited.

A data value present on a digit line 605 can be loaded into the corresponding sense amplifier 606 and/or sense amplifier 607. For example, as described in connection with FIG. 5, data values present on the digit lines 605-2 may be sensed by the sense amplifier 606 and/or the sense amplifier 607.

Each column may be coupled to memory cells 632, which can be coupled to a Column Select transistor 634 (e.g., a column decode line) that can be activated to transfer data values from corresponding sense amplifiers 606/607 to a control component external to the array such as an external processing resource (e.g., host processor and/or other functional unit circuitry). The column decode line can be coupled to a column decoder. In a number of embodiments, the data values may be transferred to the sense amplifiers 606/607 and/or transferred out of the sense amplifiers 606/607 without transferring data to a control component and/or a processing resource external to the array (e.g., without transferring data from the memory device to a host such as host 110 illustrated in FIG. 1), for instance. In some embodiments, a logical operation may be performed using operands stored in the sense amplifiers 506/507 without encumbering a host such as host 110 shown in FIG. 1. As used herein, the term "encumbering" refers to utilizing processing resources and/or transferring commands and/or data. For example, a logical operation may be performed using operands stored in the sense amplifiers 506/507 without utilizing processing resources and/or transferring commands and/or data from the memory device to the host.

As used herein, transferring data, which may also be referred to as moving data or shifting data is an inclusive term that can include, for example, copying data from a source location to a destination location and/or moving data from a source location to a destination location without necessarily maintaining a copy of the data at the source location (e.g., at the sense amplifier 606 and/or at the sense amplifier 607).

Logical operation components 611 may be coupled to the digit lines 605-1/605-2 and/or to the sense amplifiers 606/607. The logical operation components 611 may be analogous to the logical operation component 311 illustrated in FIG. 3 and/or logical operation component 511 illustrated in FIG. 5, herein.

In some embodiments, the logical operation component 611 may be configured to cause performance of a logical operation (e.g., a XOR logical operation) between data values (e.g., operands) stored in the sense amplifier 606 and the sense amplifier 607. Performance of said logical operations may be carried out using the logical operation component 611 by enabling and/or disabling various transistors that comprise the logical operation component 611, as shown and described in connection with FIG. 5, herein.

The result of a logical operation performed by use of the logical operation component 611 may be transferred via the Local I/O line from the memory array 630 and/or sensing circuitry (e.g., sensing circuitry 550 shown in FIG. 5) to circuitry external to the memory array. Embodiments are not so limited, however, and the result of the logical operation may be transferred via activation of the Column Select transistors 634 from the memory array and/or sensing circuitry to circuitry external to the memory array.

Figures 7, 8:
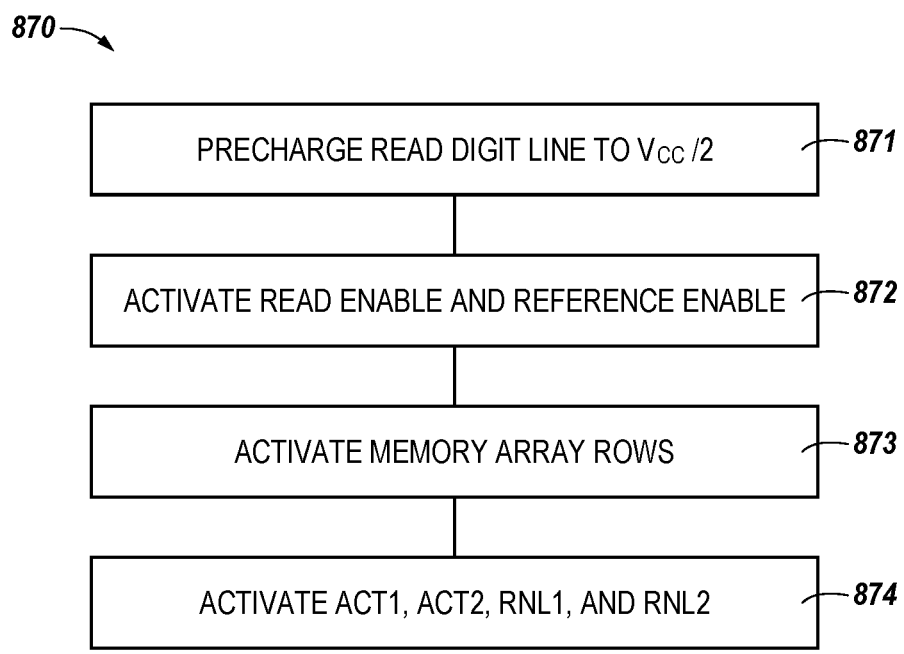
FIG. 7 is a logic table illustrating selectable logical operation results implementable in accordance with a number of embodiments of the present disclosure.
FIG. 8 is a flow diagram for performing logical operations using sensing circuitry having a logical operation component in accordance with a number of embodiments of the present disclosure.

FIG. 7 is a logic table illustrating selectable logical operation results implementable in accordance with a number of embodiments of the present disclosure. In FIG. 7, each column corresponds to a data value associated with a particular component or portion of a memory array (e.g., memory array 130 illustrated in FIG. 1) and/or a particular component or portion of the sensing circuitry (e.g., sensing circuitry 150 illustrated in FIG. 1).

The first column corresponds to a data value associated with a first row $709\text{-}1_0$ of the memory array (e.g., ROW 1). The second column corresponds to a data value associated with a first row $709\text{-}2_0$ of the memory array (e.g., ROW 2). The third column corresponds to a first sense amplifier 706 of the sensing circuitry, while the fourth column corresponds to a second sense amplifier 707 of the sensing circuitry. In the third and fourth columns, the data values correspond to data values output by the first sense amplifier and the second sense amplifier, respectively. For example, as described above in connection with FIG. 3, a data value output by the first sense amplifier 706 may correspond to performance of a NOR logical operation 761 by the first sense amplifier, and a data value output by the second sense amplifier 707 may correspond to performance of a NAND logical operation 765 by the first sense amplifier. The fifth column corresponds to a result of a XOR logical operation 763 performed by a logical operation component (e.g., logical operation component 511 illustrated in FIG. 5) using a data value stored in the first sense amplifier 706 and a data value stored in the second sense amplifier 707.

In the second row of the logic table illustrated in FIG. 7 (e.g., the first row of the logic table containing numbers), ROW 1 and ROW 2 may each include a logical value of "0." In this case, the first sense amplifier 706 may be configured to store and/or output a logical value of "1," corresponding to performance of a logical NOR operation 761. The second sense amplifier 707 may be configured to store and/or output a logical value of "1," corresponding to performance of a logical NAND operation 765. If the logical operation component is invoked to cause performance of a XOR logical operation 763 between an operand stored in the first sense amplifier 706 (e.g., a data value with a logical value of "1") and an operand stored in the second sense amplifier 707 (e.g., a data value with a logical value of "1"), the result will have a logical value of "0," as shown in FIG. 7.

In the third row of the logic table illustrated in FIG. 7 (e.g., the second row of the logic table containing numbers), ROW 1 may include a logical value of "0" and ROW 2 may include a logical value of "1." In this case, the first sense amplifier 706 may be configured to store and/or output a logical value of "0," corresponding to performance of a logical NOR operation 761. The second sense amplifier 707 may be configured to store and/or output a logical value of "1," corresponding to performance of a logical NAND operation 765. If the logical operation component is invoked to cause performance of a XOR logical operation 763 between an operand stored in the first sense amplifier 706 (e.g., a data value with a logical value of "0") and an operand stored in the second sense amplifier 707 (e.g., a data value with a logical value of "1"), the result will have a logical value of "1," as shown in FIG. 7.

In the fourth row of the logic table illustrated in FIG. 7 (e.g., the third row of the logic table containing numbers), ROW 1 may include a logical value of "1" and ROW 2 may include a logical value of "0." In this case, the first sense amplifier 706 may be configured to store and/or output a logical value of "0," corresponding to performance of a logical NOR operation 761. The second sense amplifier 707 may be configured to store and/or output a logical value of "1," corresponding to performance of a logical NAND operation 765. If the logical operation component is invoked to cause performance of a XOR logical operation 763 between an operand stored in the first sense amplifier 706 (e.g., a data value with a logical value of "0") and an operand stored in the second sense amplifier 707 (e.g., a data value with a logical value of "1"), the result will have a logical value of "1," as shown in FIG. 7.

In the fifth row of the logic table illustrated in FIG. 7 (e.g., the fourth row of the logic table containing numbers), ROW 1 and ROW 2 may each include a logical value of "1." In this case, the first sense amplifier 706 may be configured to store and/or output a logical value of "0," corresponding to performance of a logical NOR operation 761. The second sense amplifier 707 may be configured to store and/or output a logical value of "0," corresponding to performance of a logical NAND operation 765. If the logical operation component is invoked to cause performance of a XOR logical operation 763 between an operand stored in the first sense amplifier 706 (e.g., a data value with a logical value of "0") and an operand stored in the second sense amplifier 707 (e.g., a data value with a logical value of "0"), the result will have a logical value of "0," as shown in FIG. 7.

FIG. 8 is a flow diagram 870 for performing logical operations using sensing circuitry having a logical operation component in accordance with a number of embodiments of the present disclosure. In some embodiments, the logical operation may be a XOR logical operation, as described in connection with FIGS. 3, 4, 5, and 7, herein. Performance of the logical operation may include operating sense amplifiers at different reference voltages and/or enabling a XOR Enable transistor (e.g., XOR Enable transistor 518 illustrated in FIG. 5). The logical operation may be performed between data values stored in one or more memory cells and/or between data values stored in the first sense amplifier and the second sense amplifier.

At block 871, a digit line (e.g., read digit line 505-2 illustrated in FIG. 5) may be precharged to $V_{cc}/2$. In some embodiments, prior to precharging the digit line, an ACT1 (active pull-up) node of a first sense amplifier (e.g., SENSE AMP1 506 illustrated in FIG. 5), an ACT2 node of a second sense amplifier (e.g., SENSE AMP2 507 illustrated in FIG. 5), and/or an RNL1 (activation) node of the first sense amplifier and an RNL2 node of the second sense amplifier may be precharged to $V_{cc}/2$.

At block 872, a read enable transistor and a reference enable transistor may be activated (e.g., opened). In some embodiments, the read enable transistor may correspond to Read Enable1 transistor 531-1 and/or Read Enable2 transistor 531-2 illustrated in FIG. 5. The read enable transistor(s) may be enabled such that the charge on the digit line may pass through the read enable transistor(s). Subsequently, the reference enable transistor(s), which may correspond to Reference Enable1 transistor 519-1 and the Reference Enable2 transistor 519-2 illustrated in FIG. 5, may be enabled.

At block 873, one or more rows of a memory array (e.g., memory array 130 illustrates in FIG. 1) may be activated. In some embodiments, two rows, such as write row0 209-2$_0$ and write row1 209-2$_1$, illustrated in FIG. 2, may be activated. The rows may be activated to allow a data value stored in a memory cell (e.g., memory cell 232 illustrated in FIG. 2) to be transferred to the first sense amplifier and the second sense amplifier. In some embodiments, the data values stored in memory cells coupled to the rows may be sensed by the first sense amplifier and/or the second sense amplifier. For example, a signal may develop on the first sense amplifier and/or the second sense amplifier in response to activation of the rows. Subsequently, in some embodiments, the read enable transistor(s) and the reference enable transistor(s) may be disabled, as described in connection with FIG. 5, herein.

At block 874, the ACT1 node, ACT2 node, RNL1 node, and/or RNL2 node may be activated (e.g., fired). In some embodiments, activating the ACT1 node, ACT2 node, RNL1 node, and/or RNL2 node may allow a state corresponding to the digit line to be sensed by the first sense amplifier and/or the second sense amplifier. For example, activating the ACT1 node, ACT2 node, RNL1 node, and/or RNL2 node may allow for a data value present on the digit line to be sensed by the first sense amplifier and/or the second sense amplifier.

In some embodiments, once the data values are sensed by the first sense amplifier and/or the second sense amplifier, the rows may be deactivated (e.g., closed). In some embodiments, the write digit line (e.g., write digit line 505-1 illustrated in FIG. 5) may be precharged to $V_{cc}$. For example, a precharge transistor such as Precharge2 transistor 516-2 shown in FIG. 5 may be enabled to precharge the write digit line to $V_{cc}$. Subsequently, a row different than the rows previously activated may be activated, as described in connection with FIG. 5.

Once the logical operation has been performed, a result of the XOR logical operation may be transferred to a row different than the rows previously activated (e.g., to write rowN 209-2$_N$ shown in FIG. 2). In some embodiments, the result of the XOR logical operation may be stored in a memory cell coupled to the write row (e.g., to a memory cell coupled to write rowN 209-2$_N$ illustrated in FIG. 2). After the result of the XOR logical operation has been transferred to the write row that is different than the rows previously activated, the write row that is different than the rows previously activated may be disabled (e.g., closed).

In some embodiments, the result of the XOR logical operation may be read out of the sensing circuitry via a Column Select line and/or via a Local I/O line, as described in connection with FIGS. 5 and 6, herein. As described above in connection with FIG. 3, a resulting data value read out of the first sense amp (in the absence of performance of the XOR logical operation) may correspond to a data value having a NOR logical operation applied thereto or performed thereon. In some embodiments, resulting data value read out of the second sense amp (in the absence of performance of the XOR logical operation) may correspond to a data value having a NAND logical operation applied thereto or performed thereon Operations to perform a logical XOR operation in accordance with the disclosure can be summarized as follows:

Precharge ACT1 node, ACT2 node, RNL1 node, and RNL2 node
Precharge read digit line to $V_{CC}/2$
Activate Read Enable1 and Read Enable2
Activate Reference Enable1 and Reference Enable2
Activate two row lines (e.g., a first row line and a second row line)
Wait for signal to develop on a first sense amplifier and a second sense amplifier
Disable Reference Enable1 and Reference Enable2
Disable Read Enable1 and Read Enable2
Activate ACT1 node, ACT2 node, RNL1 node, and RNL2 node
Disable first row line and second row line
Precharge write digit line to $V_{cc}$
Enable a third row line
Active XOR logical operation component
Disable third row line Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving, by a first sense amplifier, a first data value via a read digit line;
   receiving, by a second sense amplifier, a second data value via the read digit line;
   activating a first read row line and a second read row line;
   activating the first sense amplifier to perform a first selected logical operation without activating the second sense amplifier;
   activating the second sense amplifier to perform a second selected logical operation without activating the first sense amplifier and;
   activating the first sense amplifier and the second sense amplifier concurrently while the first and the second read row lines are activated to perform a third selected logical operation based, at least in part, on a rate at which the read digit line is discharged.

2. The method of claim 1, further comprising:
   deactivating the first read row line and the second read row line;
   activating a third read row line;
   activating a XOR logical operation component coupled to the first sense amplifier and the second sense amplifier; and
   activating the first sense amplifier and the second sense amplifier concurrently to perform the third selected logical operation using the XOR logical operation component.

3. The method of claim 2, further comprising causing a result of the first selected logical operation, the second selected logical operation, or the third selected logical operation, or any combination thereof, to be stored in at least one of the first sense amplifier and the second sense amplifier.

4. The method of claim 1, wherein performing the first selected logical operation or the second logical operation comprises performing at least one of a NOR logical operation and a NAND logical operation.

5. The method of claim 1, wherein the first sense amplifier has a first trip point associated therewith, and wherein the second sense amplifier has a second trip point associated therewith.

6. The method of claim 1, further comprising performing the first logical operation or the second logical operation, or both, without enabling an input/output signal path coupling the memory array to a host.

7. The method of claim 1, wherein the first sense amplifier has a first reference voltage associated therewith, and wherein the second sense amplifier has a second reference voltage associated therewith.

8. An apparatus, comprising:
   sensing circuitry comprising a first sense amplifier and a second sense amplifier; and
   a controller coupled to the sensing circuitry, wherein the controller is to:
      cause the first sense amplifier to receive a first data value via a read digit line;
      cause the second sense amplifier to receive a second data value via the read digit line;
      cause a first read row line and a second read row line coupled to the sensing circuitry to be activated;
      cause the first sense amplifier to perform a first selected logical operation without activating the second sense amplifier;
      cause the second sense amplifier to perform a second selected logical operation without activating the first sense amplifier; and
      cause the first sense amplifier and the second sense amplifier, while the first and the second read row lines are activated, to concurrently perform a third selected logical operation based, at least in part, on a rate at which the read digit line is discharged.

9. The apparatus of claim 8, wherein the first sense amplifier has a first reference voltage associated therewith, and wherein the second sense amplifier has a second reference voltage associated therewith.

10. The apparatus of claim 8, wherein the first sense amplifier has a first trip point associated therewith, and wherein the second sense amplifier has a second trip point associated therewith.

11. The apparatus of claim 8, wherein performing the first selected logical operation or the second logical operation comprises performing at least one of a NOR logical operation and a NAND logical operation.

12. The apparatus of claim 8, wherein the controller is to:
    cause the first read row line and the second read row line to be deactivated;
    cause a third read row line to be activated;
    cause a XOR logical operation component coupled to the first sense amplifier and the second sense amplifier to be activated; and
    cause the first sense amplifier and the second sense amplifier to be activated concurrently to perform the third selected logical operation using the XOR logical operation component.

13. The apparatus of claim 12, wherein the controller is to cause a result of the first selected logical operation, the second selected logical operation, or the third selected logical operation to be stored in at least one of the first sense amplifier and the second sense amplifier.

14. A system, comprising:
a plurality of three-transistor (3T) memory cells coupled to respective write digit lines, read digit lines, read row lines, and write row lines;
sensing circuitry comprising a first sense amplifier, a second sense amplifier, and a logical operation component coupled to the plurality of 3T memory cells; and
a controller configured to:
cause the first sense amplifier to receive a first data value via a read digit line;
cause the second sense amplifier to receive a second data value via the read digit line; and
cause performance of a selected logical operation between data values stored in a first memory cell coupled to a first read row line and a second memory cell coupled to a second read row line, wherein:
performing a first selected logical operation comprises, while the first and the second read row lines are activated, activating the first sense amplifier without activating the second sense amplifier,
performing a second selected logical operation comprises, while the first and the second read row lines are activated, activating the second sense amplifier without activating the first sense amplifier, and
performing a third selected logical operation comprises, while the first and the second read row lines are activated, activating the first sense amplifier and the second sense amplifier based, at least in part, on a rate at which the read digit line is discharged.

15. The system of claim 14, wherein the controller is configured to cause a result of the first selected logical operation, the second selected logical operation, or the third selected logical operation to be stored in at least one of the first sense amplifier and the second sense amplifier.

16. The system of claim 14, wherein the controller is configured to cause performance of the first selected logical operation, the second selected logical operation, or the third selected logical operation without transferring the first data value or the second data value to a location external to the sensing circuitry or the plurality of 3T memory cells.

17. The system of claim 14, further comprising a host coupled to the plurality of 3T memory cells, wherein the controller is configured to cause performance of the first selected logical operation, the second selected logical operation, or the third selected logical operation without the host performing a host operation.

18. The system of claim 14, wherein the plurality of 3T memory cells are configured to:
invert the first data value prior to transferring the first data value to the first sense amplifier; and
invert the second data value prior to transferring the second data value to the second sense amplifier.

19. The system of claim 14, wherein the system includes:
a memory device comprising the plurality of 3T memory cells, the sensing circuitry, and the controller; and
a host coupled to the memory device, wherein the controller is further configured to cause performance of the first selected logical operation, the second selected logical operation, or the third selected logical operation without transferring data from the memory device to the host.

20. The system of claim 14, wherein the first selected logical operation comprises a NOR logical operation, the second selected logical operation comprises a NAND logical operation, and the third selected logical operation comprises a XOR logical operation.

* * * * *